United States Patent
Ohashi et al.

(10) Patent No.: US 6,811,073 B2
(45) Date of Patent: Nov. 2, 2004

(54) METHOD FOR CONNECTING CONDUCTIVE MEMBERS

(75) Inventors: Hitoshi Ohashi, Susono (JP); Hitoshi Ushijima, Susono (JP)

(73) Assignee: Yazaki Corporation, Tokyo (JP)

(*) Notice: Subject to any disclaimer, the term of this patent is extended or adjusted under 35 U.S.C. 154(b) by 61 days.

(21) Appl. No.: 10/286,850

(22) Filed: Nov. 4, 2002

(65) Prior Publication Data

US 2003/0098342 A1 May 29, 2003

(30) Foreign Application Priority Data

Nov. 26, 2001 (JP) ................................. P2001-359040

(51) Int. Cl.⁷ ................. B23K 35/12; B23K 31/02; B21D 39/00
(52) U.S. Cl. ................. 228/256; 228/260; 228/261; 228/165
(58) Field of Search .............. 228/121.1, 123.1, 228/256, 257, 260, 261, 164, 165, 144

(56) References Cited

U.S. PATENT DOCUMENTS 6,312,974 B1 * 11/2001 Wu et al. .................. 438/107
6,501,663 B1 * 12/2002 Pan ............................ 361/779
6,589,594 B1 *  7/2003 Hembree .................... 427/97

FOREIGN PATENT DOCUMENTS

| JP | 10-56524    | 6/1998 |
| JP | 10-195676   | 7/1998 |
| JP | 10-226803   | 8/1998 |
| JP | 2000-244086 | 9/2000 |

* cited by examiner

Primary Examiner—Steven Bos
Assistant Examiner—Colleen P. Cooke
(74) Attorney, Agent, or Firm—Sughrue Mion, PLLC

(57) ABSTRACT

A method for connecting conductive members includes a step of providing a first conductive member, a step of providing a second conductive member, and a step of jetting droplets of molten metal so as to form a connecting portion which electrically connects the first conductive member to the second conductive member.

21 Claims, 7 Drawing Sheets

METHOD FOR CONNECTING CONDUCTIVE MEMBERS

BACKGROUND OF THE INVENTION

The present invention relates to a method for connecting conductive members, such as connecting FPCs (flexible printed circuit) each other, or connecting the FPC to a terminal.

In FIG. 11 of the attached drawings, the FPC 1 is formed by arranging a circuit pattern (conducting portion 3) being a conductor such as copper on an insulating film 2 as polyimide through an adhesive material, and further pasting thereon the same insulating film 4 as the above mentioned film through the adhesive material. Since such an FPC 1 has flexibility and a conducting portion 3 is patterned between the insulating films 2 and 4, wiring is very easy, and in particular, the FPC is much adopted to connections between complicated circuits or units.

Incidentally, for connecting the FPCs 1 each other, as shown in FIGS. 12 or 13, it is generally practiced to employ a connecting method using a supersonic welding technique or a spot welding technique.

In FIG. 12, the connecting method using the supersonic welding technique comprises arranging the mutual FPCs 1 by piling them in vertical directions, holding their vertical both sides between a supersonic welding horn 5 and an anvil 6, and applying supersonic vibration thereto so as to weld conducting portions 3 each other (as to a connected condition, refer to FIG. 14).

In FIG. 13, the connecting method using the spot welding technique comprises arranging the mutual FPCs 1 having parts removing insulating films 2 and 4 by meeting parts 7 without the insulating films 2 and 4 to pile them in the vertical directions, holding both vertical ends between electrodes 8, concentrating electric current and pressure for locally heating them so as to weld the conducting portions each other (resistance welding) (as to a connected condition, refer to FIG. 14).

The above mentioned related methods have the following problems.

Firstly, the connecting method using the supersonic welding technique is involved with a problem that a connection accomplished state cannot be confirmed from the outside. Unless confirming from the outside, occurrence of non-welded parts as shown with an arrow P in FIG. 15 cannot be found (only the insulating films 2 and 4 are welded, and the mutual FPCs 1 are thereby fixed each other). Further, another problem is that in the connecting method using the supersonic welding technique, if frictional heat by the supersonic vibration is large, a conducting portion 3 is ruptured.

Secondly, the connecting method using the spot welding technique has a problem that because current is applied between electrodes 8, the insulating films 2 and 4 must be in advance removed from both upper and rear faces for forming the parts 7 removing the insulating films 2 and 4, taking very much trouble.

As to other problems, being in common to the respective connecting techniques, the insulating films 2 and 4 are deformed owing to connecting heat, spoiling insulation. In addition, when connecting, pressure must be effected from vertical direction by connecting units, inviting rupture of the conducting portion 3 or large sizing scales of units. After connecting (after welding), since exposed parts occur in the conducting portion 3 in vertical direction, both sides must be sealed with insulators 9, also herein taking very much trouble.

SUMMARY OF THE INVENTION

It is therefore an object of the present invention to provide a method for connecting FPCs capable of heightening workability, avoiding ruptures in the conducting portions and reduction of insulation, and enabling to confirm the connection accomplished state from the outside, thereby to increase reliability.

In order to achieve the above object, according to the present invention, there is provided a method for connecting conductive members comprising the steps of:

providing a first conductive member;
  providing a second conductive member; and
  jetting droplets of molten metal so as to form a connecting portion which electrically connects the first conductive member with the second conductive member.

Preferably, the method further comprising the steps of:
  solidifying the connecting portion provided between the first conductive member and the second conductive member: and
  sealing the connecting portion and an exposed portion of the first and second conductive members with an insulator.

Preferably, the first conductive member and the second conductive member are contacted with each other.

Preferably, the first conductive member and the second conductive member are separated from each other.

Preferably, the first conductive member and the second conductive member are piled each other in a vertical direction.

Here, it is preferable that an insulating film is interposed between the first conductive member and the second conductive member.

In the method, the conductive members are easily electrically connected by the connecting portion comprised of the molten metal drops, and after connection, whether the connection is accomplished or immature is seen through visual confirmation of an adhered condition of jetted or dripped the molten metal drops. Further, heat toward the conductive members at connecting is low in parts under connection because of using molten metal drops, and molten metal drops never make heat causing rupture of the conductive member or reduction of insularity of insulating film when the conductive member is a conductive portion of a flexible printed circuit. Besides, a part exposed in the conductive member is limited as small as possible, and sealing of an insulator after connection is enough only at the exposed portion of the conductive member, thereby to increase workability.

Preferably, at least one of the first conductive member and the second conductive member has a through-hole in which the connecting portion electrically connects the first conductive member with the second conductive member via the through-hole.

In the method, the conductive members are easily electrically connected by the connecting portion comprised of the molten metal drops, and after connection, whether the connection is accomplished or immature is seen through visual confirmation of an adhered condition of jetted or dripped the molten metal drops. Further, heat toward the conductive members at connecting is low in parts under connection because of using molten metal drops, and molten metal drops never make heat causing rupture of the conductive member or reduction of insularity of insulating film when the conductive member is a conductive portion of a flexible printed circuit. Besides, a part exposed in the conductive member is limited as small as possible, and sealing of an insulator after connection is enough only at the exposed portion of the conductive member, thereby to increase workability.

Preferably, a flexible printed circuit is constituted of a conductive portion covered with an insulating film. The first conductive member and the second conductive member are exposed conductive portions, each of the exposed conductive portions which formed by removing the insulating film from the flexible printed circuit so as to expose the conductive portion.

Preferably, a flexible printed circuit is constituted of a conductive portion covered with an insulating film. One of the first conductive member and the second conductive member is an exposed conductive portion which formed by removing the insulating film from the flexible printed circuit so as to expose the conductive portion, and another is a terminal.

In the methods, since the conductive member is the flexible printing circuit or the terminal, the connection is available in the flexible printing circuit to the flexible printing circuit or the flexible printing circuit to the terminal.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

A first embodiment of a method for connecting FPCs according to the invention will be described in detail by reference to the drawings.

Figure 1:
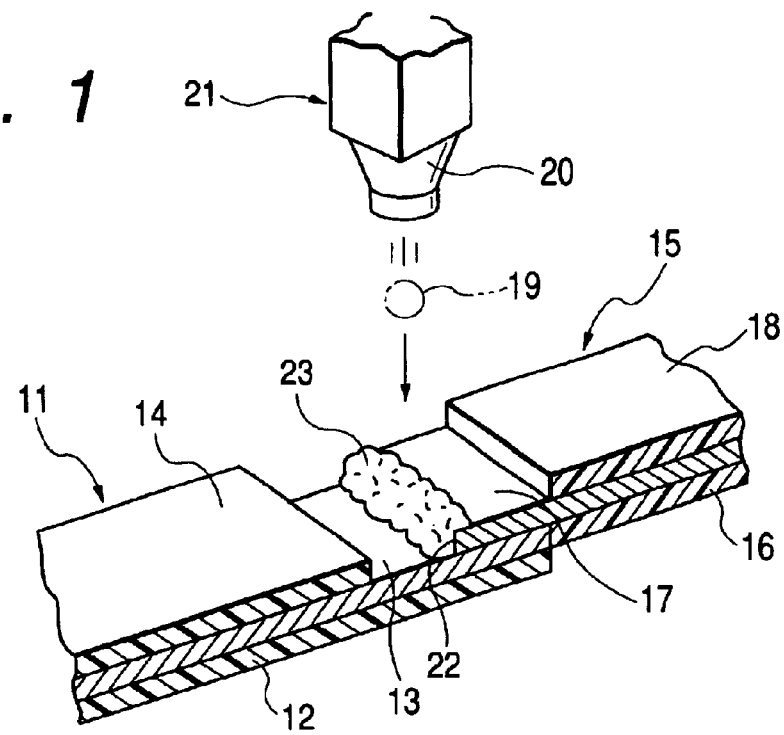
FIG. 1 shows a perspective view (including a cross section) when connecting an FPC to another FPC according to a first embodiment of the FPC connecting method of the invention.
Figure 2:
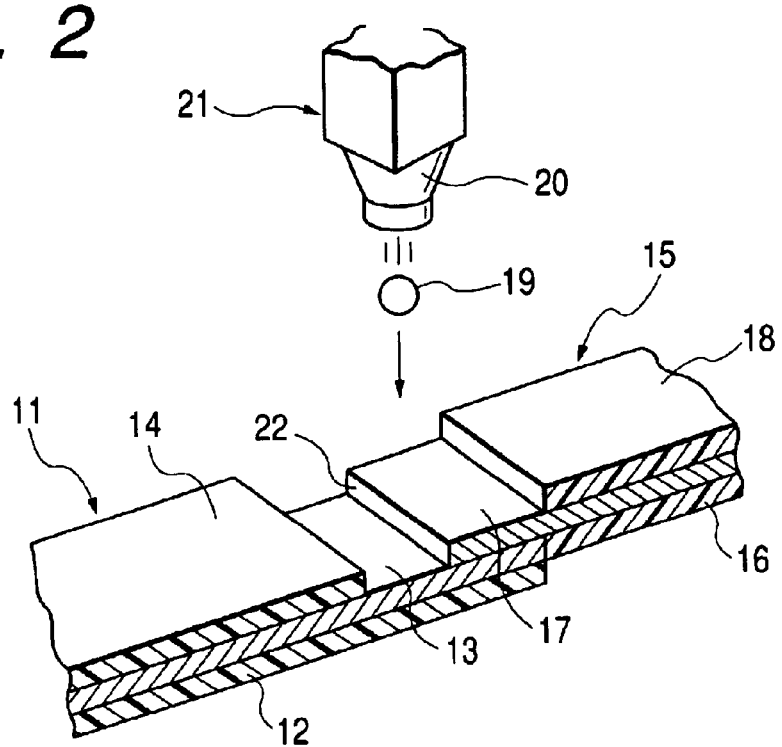
FIG. 2 shows a perspective view (including a cross section) of the state immediately before connecting the FPC to the FPC.
Figure 3:
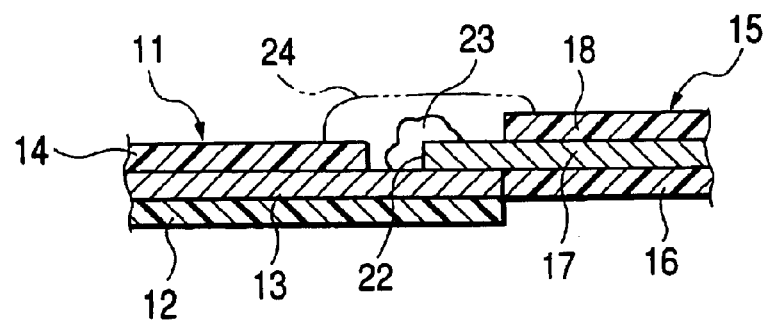
FIG. 3 shows a cross sectional view of the state while connecting the FPC to the FPC.

FIG. 1 is a perspective view (including a cross section) when connecting the FPC, showing the first embodiment of the FPC connecting method of the invention. FIG. 2 is a perspective view (including a cross section) showing a state immediately before connecting the FPC. FIG. 3 is a cross sectional view showing the state while connecting the FPC. Note that, in the present specification, the structures are shown by overdrawing thickness for easily understanding.

Composing members will be firstly explained in detail. In FIGS. 1 and 2, the FPC (flexible printed circuit) 11 includes an insulating film 12 made of, for example, polyimide, a plurality of conducting portions 13 (only one shown) made of, e.g., copper having conductivity on the insulating film 12 via an adhesive material, and an insulating film 14 made of, e.g., polyimide pasted thereon through the adhesive material. The FPC 11 has a part of removing the upper sided-insulating film 14 being a terminal part thereof, and the surface of the conducting portion 13 is formed under an exposed condition in an appropriate range.

In contrast, the FPC 15 includes an insulating film 16 being the same as the FPC 11, a plurality of conducting portions 17 (only one shown) and an insulating film 18. The FPC 15 has parts of removing the insulating films 16 and 18 being terminal parts thereof, and the surface of the conducting portion 17 is formed under the exposed condition in an appropriate range.

On the other hand, a molten metal drop 19 is formed by melting a metal having conductivity. The molten metal drop 19 is formed by jetting from a nozzle by using, e.g., a piezoelectric element or gas, sending liquid droplet of a wire molten by discharge, or jetting metal powders from a nozzle and melting by a laser. In the first embodiment, the molten metal drop 19 is formed by a molten metal drop jetting apparatus 21 (later mentioned) having a nozzle 20.

The FPC connecting method of the invention will be detailed described below on the basis of the above mentioned respective structures. The inventive FPC connecting method passes through the following procedures.

In a first process, as shown in FIG. 2, the FPC 11 and the FPC 15 are arranged by piling in the vertical direction such that the conducting portion 13 of the FPC 11 is connected at the upper surface thereof to the rear surface of the conducting portion 17 of the FPC 15. Preferably, the arrangement is made such that the conducting portion 13 of the FPC 11 contacts at its end portion to an end portion of the lower sided-insulating film 16.

In a second process after the first process, a step 22 is formed between the surface of the conducting portion 13 of the FPC 11 and the surface of the conducting portion 17 of the FPC 15, and the molten metal drops 19 are jetted or dripped thereon. The molten metal drops 19 are adhered to the surface of the conducting portion 13 of the FPC 11 and the surface of the conducting portion 17 of the FPC 15, holding the step 22 therebetween. By an agglomerate 23 of the adhered molten metal drops 19, states as shown in FIGS. 1 and 3 are produced, and as a result, the FPC 11 and the FPC 15 are electrically connected.

After accomplishing the second process, a third process is performed as follows. In the third process, for protecting from the outside the surface of the conducting portion 13 of the FPC 11 under the exposed condition, the surface of the conducting portion 17 of the FPC 15, and the agglomerate 23 of the molten metal drops 19, an insulator 24 is sealed over the upper insulating films 14 and 18 (see FIG. 3).

The FPC connecting method is characterized by mutually connecting the FPC 11 and the FPC 15 by use of the molten metal drops 19. Therefore, as seen from the above explanation and the drawings, the FPC 11 and the FPC 15 can be easily connected. Further, since the FPC 11 and the FPC 15 are connected by use of the molten metal drops 19, the adhering condition (the condition of the agglomerate 23) of the molten metal drops 19, that is, the connection accomplishing condition can be visually confirmed, so that reliability depending on the connection can be more heightened than the connecting method using the related supersonic welding technique.

Further, since the FPC 11 and the FPC 15 are connected by use of the molten metal drops 19, heat toward the conducting portion 13 of the FPC 11 and the conducting portion 17 of the FPC 15 at connecting is low enough at these connected parts than in the connecting method using the related supersonic welding technique or the spot welding technique, consequently enabling to avoid rupture in the conducting portions 13 and 17 or reduction of insulation of the insulating films 12, 14, 16 and 18.

Besides, parts exposed in the conducting portions 13 and 17 are limited as small as possible, and the sealing on the insulator 24 after connection is enough only at surface sides of the conducting portions 13 and 17 of the FPCs 11 and 15, thereby to increase workability.

Figure 4:
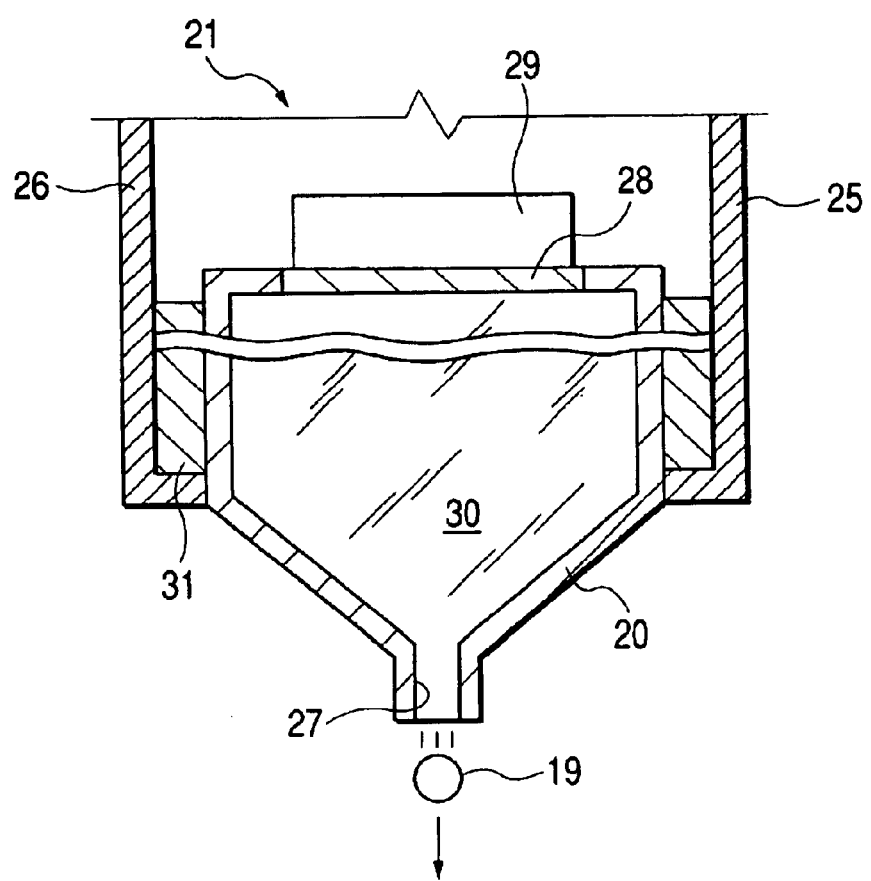
FIG. 4 shows a cross sectional view of a molten metal drop jetting apparatus.

Next, the structure of the molten metal jetting apparatus 21 will be described below, referring to FIG. 4 which is a cross sectional view of the molten metal drop jetting apparatus.

The molten metal drop jetting apparatus 21 includes a molten metal drop forming portion 25, a molten metal supply source (not shown) for melting a metal having conductivity and supplying it to a molten metal drop forming portion 25, and a moving unit (not shown) for moving the molten metal drop forming portion 25.

The molten metal drop forming portion 25 has a casing 26, a nozzle 20 having a hole 27 and projecting at the lower end of the casing 26, a diaphragm 28 disposed, e.g., in opposition to the hole 27, a piezoelectric element 29 for vibrating the diaphragm 28, and a heater 31 for heating or keeping hot the molten metal 30 filled in the nozzle 20, and when the molten metal 30 passes through the hole 27, it becomes a molten metal drop 19 and gets out intermittently (each time when the diaphragm 28 vibrates, the molten metal drop 19 is formed).

Vibration of the diaphragm 28 may depend on a manner of applying pressure by such as gas other than the piezoelectric element 29. The amount of the molten metal drops 19 jetted intermittently by vibration of the diaphragm 28, time-interval thereof and diameter of the same are appropriately determined. Other than the structure using the diaphragm 28, a structure using a cylinder may be listed.

Figure 5:
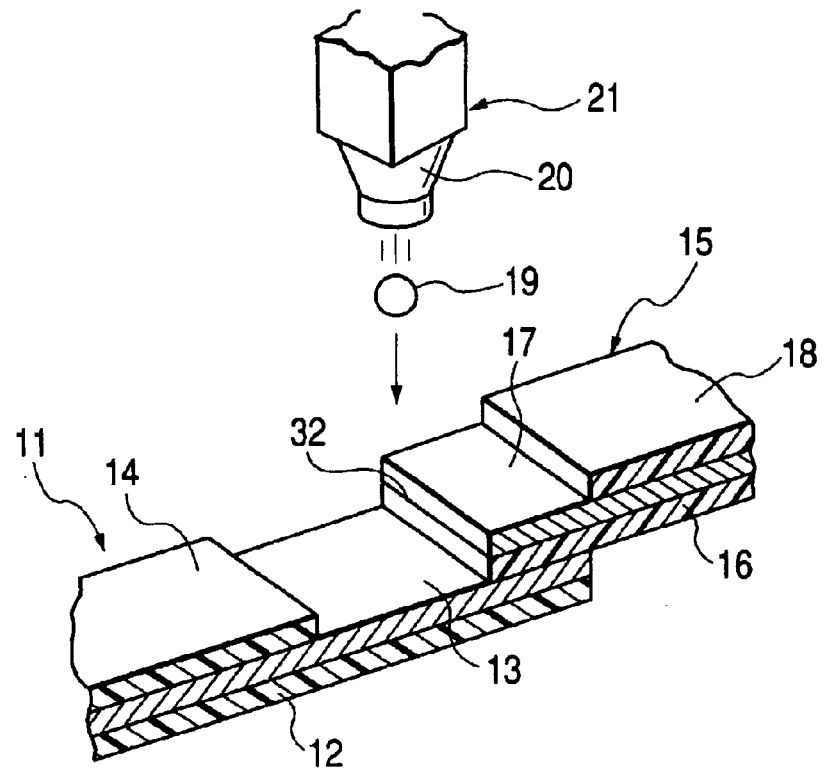
FIG. 5 shows a perspective view (including the cross section) immediately before the FPC connection according to a second embodiment of the FPC connecting method of the invention.
Figure 6:
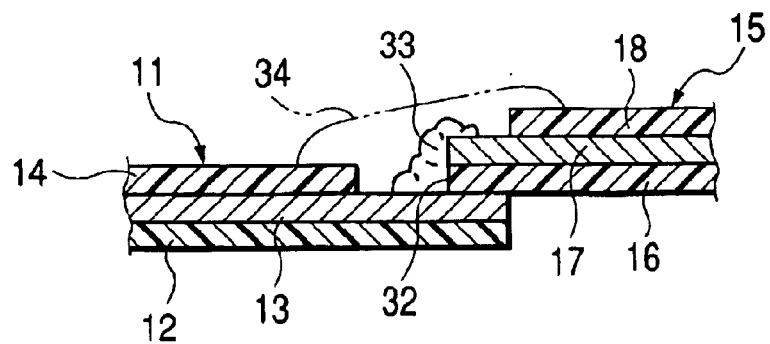
FIG. 6 shows a cross sectional view of a condition when connecting the FPC to the FPC of FIG. 5.

Subsequently, a second embodiment of the FPC connecting method according to the invention, referring to FIGS. 5 and 6. FIG. 5 is a perspective view (including the cross section) immediately before the FPC connection showing the second embodiment. FIG. 6 is a cross sectional view showing a condition when connecting the FPCs of FIG. 5. The composing members being basically the same as those of the first embodiment will be given the same numerals for omitting detailed explanation.

In FIG. 5, the FPC 11 has a part of removing the upper insulating film 14 being a terminal part thereof, and the surface of the conducting portion 13 is formed under the exposed condition in an appropriate range. On the other hand, the FPC 15 also has a part of removing the upper insulating film 18 being a terminal part thereof, and the surface of the conducting portion 17 is formed under the exposed condition in an appropriate range (in the first embodiment, the rear face of the conducting portion 17 is exposed, but in the second embodiment, the rear face of the conducting portion 17 is covered with the insulating film 16).

A FPC connecting method according to the second embodiment of the invention will be described below on the basis of the above mentioned respective structures. The inventive FPC connecting method in the second embodiment passes through the following procedures.

In the first process, the FPCs 11 and 15 are arranged by piling them in the vertical direction. Namely, the FPCs 11 and 15 are arranged by piling them in the vertical direction such that the conducting portion 13 of the FPC 11 is contacted on the surface thereof to the lower sides insulating film 16 of the FPC 15 (as the rear face of the conducting portion 17 is not exposed, is does not contact to the conducting portion 13 of the FPC 11 as the first embodiment).

In the second process after the first process, a step 32 is formed between the surface of the conducting portion 13 of the FPC 11 and the surface of the conducting portion 17 of the FPC 15, and the molten metal drops 19 are jetted or dripped thereon. The molten metal drops 19 are adhered to the surface of the conducting portion 13 of the FPC 11 and the surface of the conducting portion 17 of the FPC 15, holding the step 32 therebetween. By an agglomerate 33 of the adhered molten metal drops 19, a state as shown in FIG. 6 is produced, and as a result, the FPC 11 and the 15 are electrically connected.

After accomplishing the second process, the third process is performed as follows. In the third process, for protecting the surface under the exposed condition of the conducting portion 13 of the FPC 11, the surface of the conducting portion 17 of the FPC 15, and the agglomerate 33 of the molten metal drops 19, an insulator 34 is sealed over the upper insulating films 14 and 18.

The inventive FPC connecting method of the second embodiment is characterized by mutually connecting the FPCs 11 and 15 by use of the molten metal drops 19 similarly to the FPC connecting method explained in the first embodiment. Accordingly, similar effects can be brought about as in the FPC connecting method referred to in the first embodiment.

Figure 7:
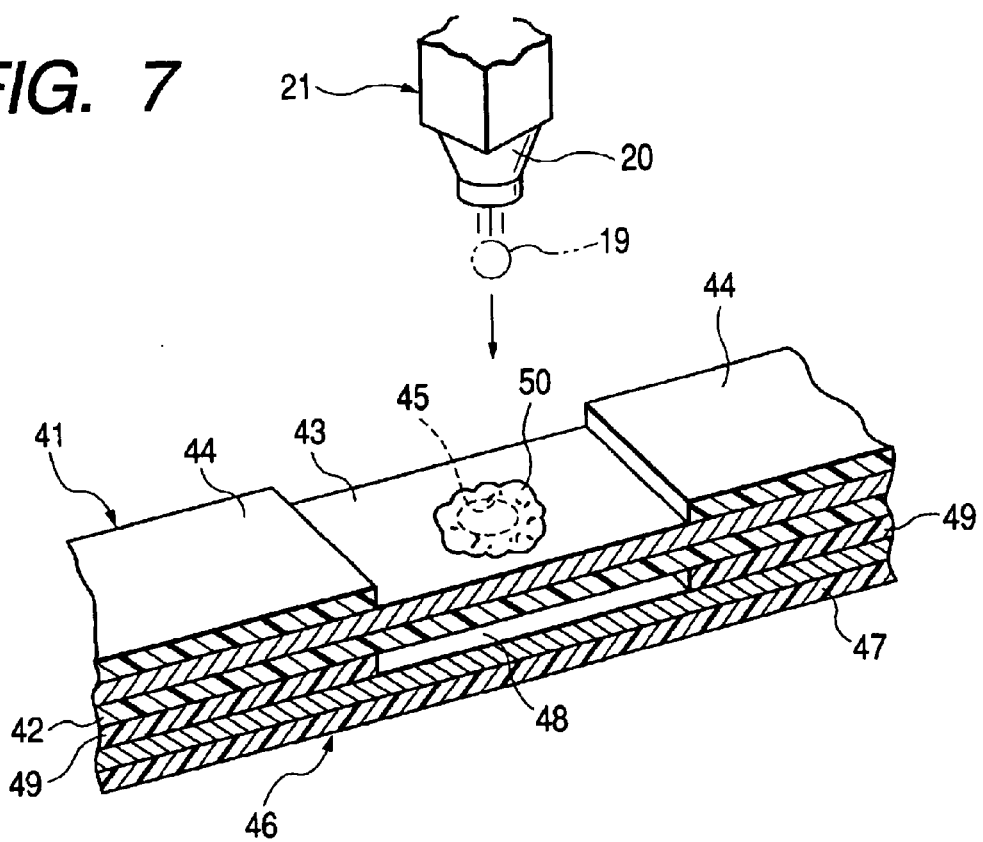
FIG. 7 shows a perspective view (including a cross section) when connecting an FPC to another FPC according to a third embodiment of the inventive FPC connecting method.
Figure 8:
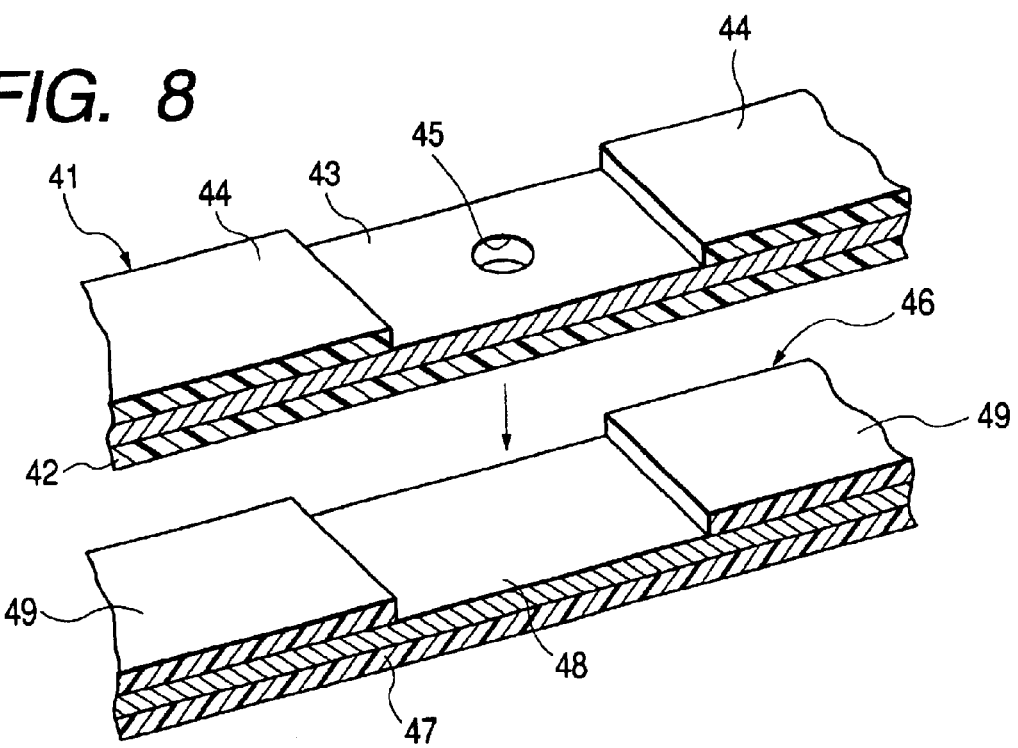
FIG. 8 shows a cross sectional view (including a cross section) of a condition before connecting the FPC to the FPC of FIG. 7.
Figure 9:
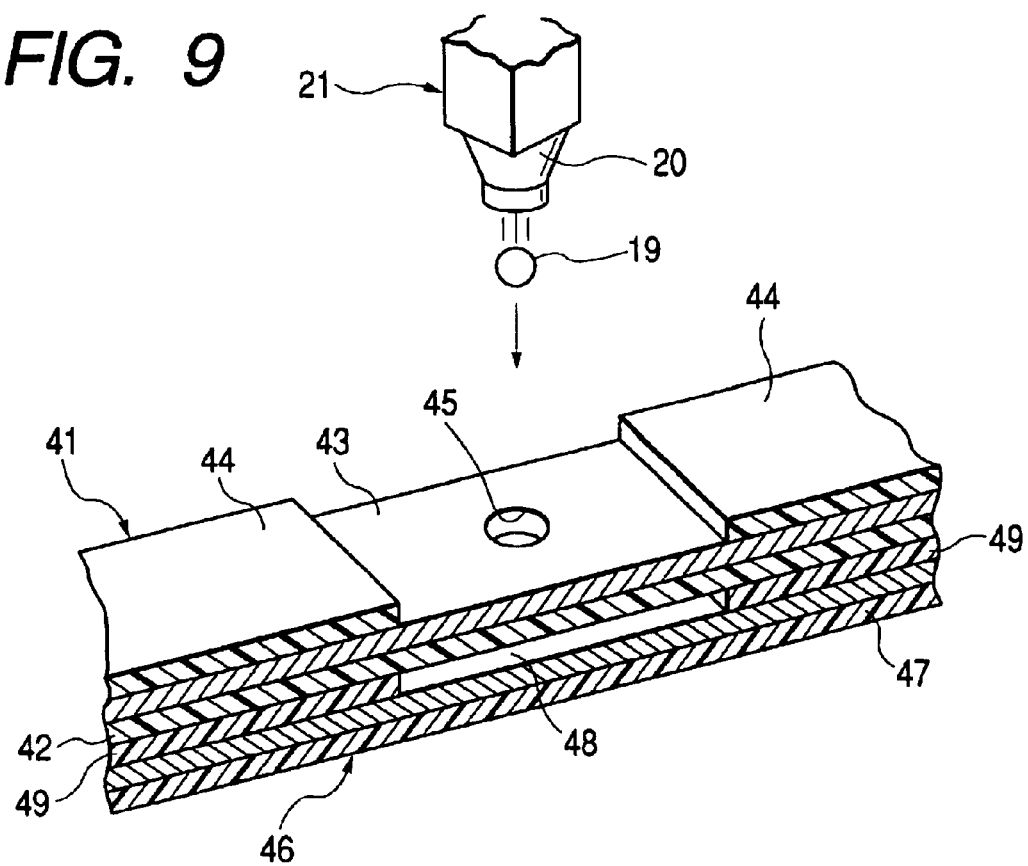
FIG. 9 shows a cross sectional view (including a cross section) of a condition immediately before connecting the FPC to the FPC of FIG. 7.
Figure 10:
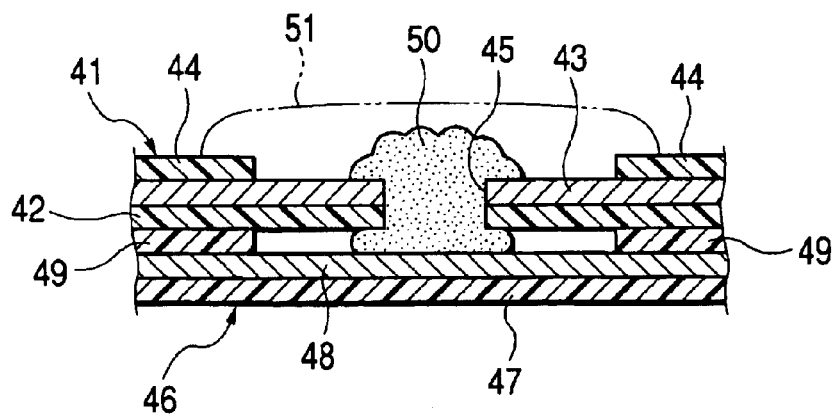
FIG. 10 shows a cross sectional view of a condition when connecting the FPC to the FPC of FIG. 6.
Figure 11:
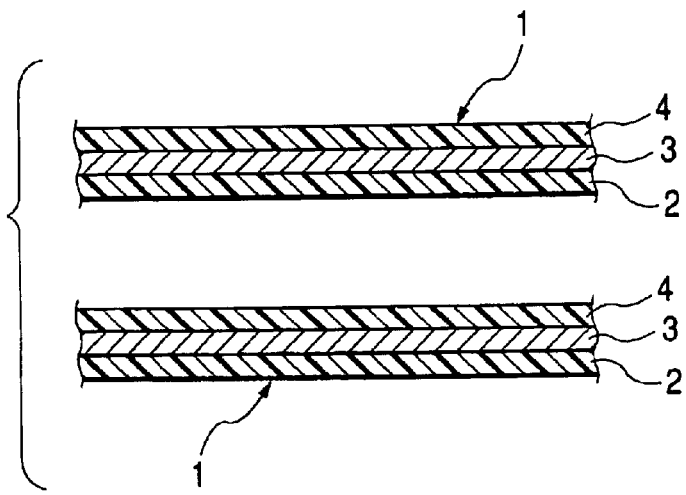
FIG. 11 shows a cross sectional view of an FPC of a related example.
Figure 12:
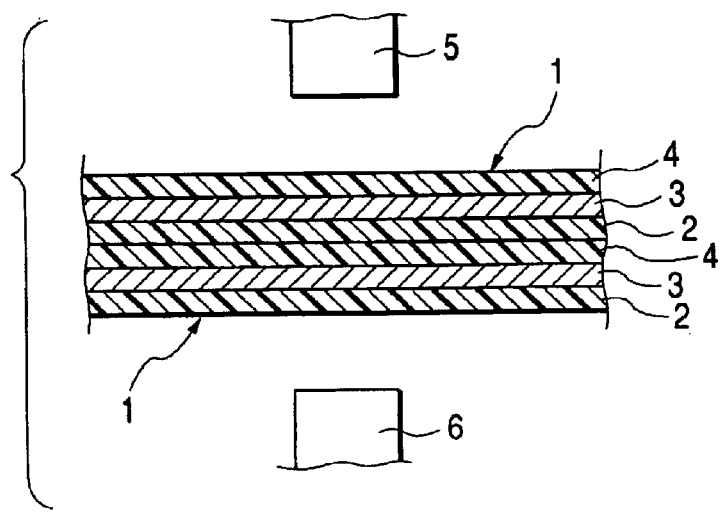
FIG. 12 shows a cross sectional view of piled FPCs for explaining the related example using a supersonic welding technique.
Figure 13:
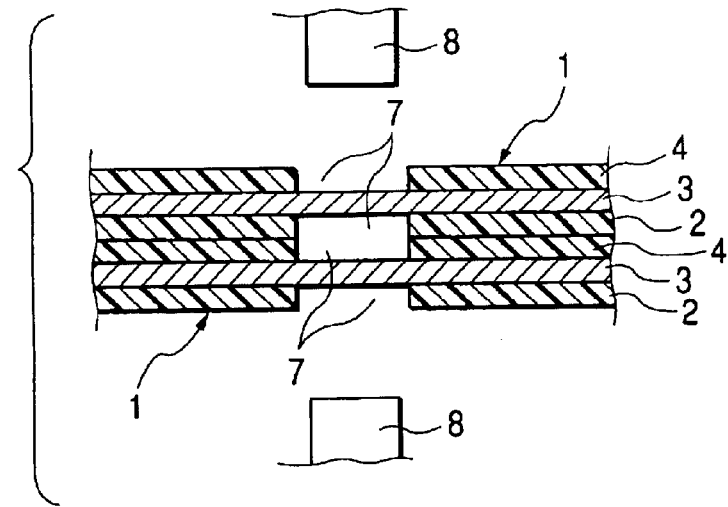
FIG. 13 shows a cross sectional view of piled FPCs for explaining the related example using a spot welding technique.
Figure 14:
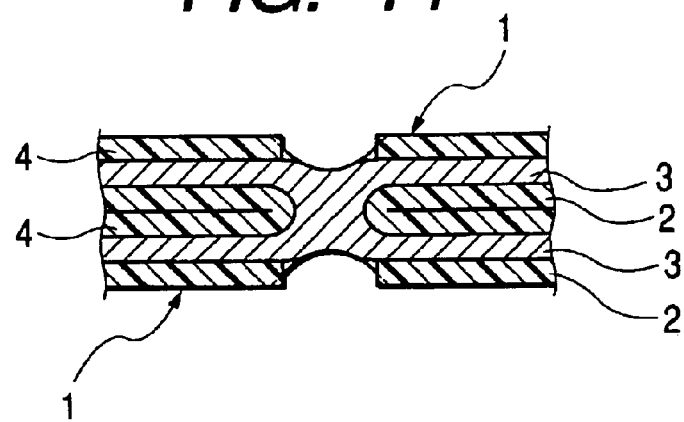
FIG. 14 shows a cross sectional view of the FPCs connected by the related method using the supersonic welding technique or the spot welding technique.
Figure 15:
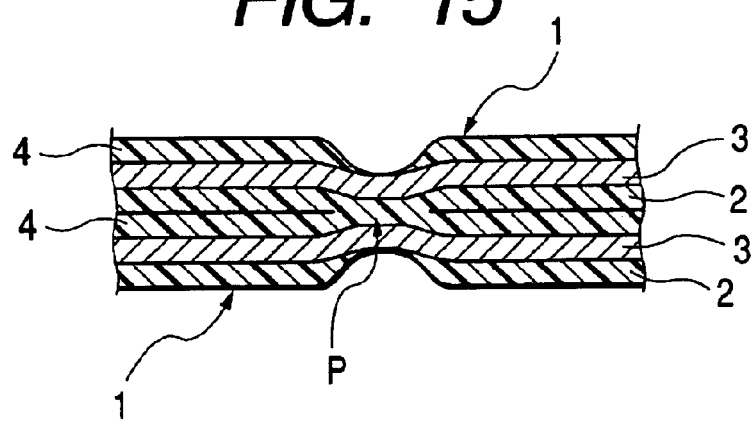
FIG. 15 shows a cross sectional view of the FPCs for explaining problems caused in the related method using the supersonic welding technique or the spot welding technique.
Figure 16:
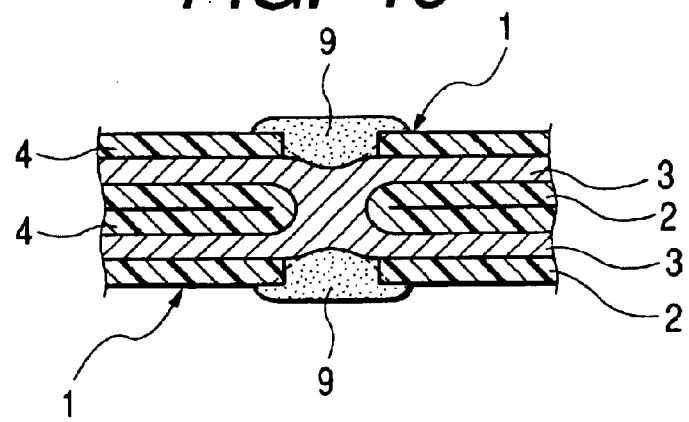
FIG. 16 shows a cross sectional view of the FPCs sealed on the insulating part after connection explained in FIG. 14.

Subsequently, a third embodiment of the FPC connecting method according to the invention will be explained, referring to FIGS. 7 to 10. FIG. 7 is a perspective view (including the cross section) at the FPC connection showing the third embodiment. FIG. 8 is a cross sectional view showing a condition before connecting the FPCs of FIG. 7 (including the cross section). FIG. 9 is a perspective view (including the cross section) showing a state immediately before the FPC connection of FIG. 7 (including the cross section). FIG. 10 is a cross sectional view showing a state when connecting the FPCs.

Composing members will be firstly explained in detail. In FIGS. 7 and 8, the FPC (flexible printed circuit) 41 includes an insulating film 42 made of, for example, polyimide, conducting portion 43 made of, e.g., a plurality of coppers (only one shown) having conductivity arranged on the insulating film 42 via the adhesive material, and an insulating film 44 made of, e.g., polyimide pasted thereon through the adhesive material. The FPC 41 has a part of removing the upper sided-insulating film 44 being an intermediate part thereof (the terminal part may be sufficient), and the surface of the conducting portion 43 is formed under the exposed condition in an appropriate range. The exposed conducting portion 43 is provided with a through-hole 45 of an appropriate size (the through-hole corresponding to a lower sided-insulating film 42 may be arbitrarily determined).

In contrast, the FPC 46 includes an insulating film 47 being the same as the FPC 41, a plurality of conducting portions 48 (only one shown) and an insulating film 49. The FPC 46 has a part of removing the upper sided-insulating film 49 being an intermediate part thereof (a terminal part is sufficient), and the surface of the conducting portion 48 is formed under the exposed condition in an appropriate range (the FPC 46 does not have the through-hole, but this is not applied to a case where the FPC 46 is disposed on the FPC 41 when connecting as later mentioned).

A FPC connecting method according to the third embodiment of the invention will be described below on the basis of the above mentioned respective structures, passing through the following procedures.

In the first process, as shown in FIG. 8, an FPC 41 and an FPC 46 are opposed vertically, and as shown in FIG. 9, the mutual FPCs 41 and 46 are piled in the vertical direction.

In a second process, the molten metal drops 19 are jetted or dripped on the through-hole 45, and when the lower sided-insulating film 42 of the FPC 41 is melted by the molten metal drop 19 and penetrates, the molten metal drops 19 are adhered to the surface of the conducting portion 43 of the FPC 41 and the surface of the conducting portion 48 of the FPC 46. By the agglomerate 50 of the adhered molten metal drops, the states are produced as shown in FIGS. 7 or 10, and consequently the FPCs 41 and 46 are electrically connected.

After accomplishing the second process, a third process is performed as follows. In the third process, for protecting at the outside the surface under the exposed condition of the conducting portion 43 of the FPC 41, and the agglomerate 50 of the molten metal drops 19, an insulator 51 is sealed over both sides of the parts of removing the upper sided-insulating film 44 (see FIG. 10).

The inventive FPC connecting method according to the third embodiment is characterized by mutually connecting the FPCs 41 and 46 by use of the molten metal drops 19 similarly to the first and second embodiments. Accordingly, similar effects can be brought about as in the FPC connecting method referred to the first and second embodiments.

Of course, so far as not altering the subject matter of the invention, various modifications are available. That is, the FPC 15 is substituted with a tab-like terminal for connecting it to the FPC 11. Further, similarly, the FPC 46 is substituted with the tab-like terminal for connecting it to the FPC 41. A bas-bur, PCB or FPC may be enumerated other than the tab-like terminal.

What is claimed is:

1. A method for connecting conductive members, comprising the steps of:
   providing a first conductive member;
   providing a second conductive member; and
   jetting droplets of molten metal so as to form a connecting portion which electrically connects the first conductive member with the second conductive member;
   wherein a flexible printed circuit is constituted of a conductive portion covered with an insulating film; and
   wherein the first conductive member and the second conductive member are exposed conductive portions, each of the exposed conductive portions which formed by removing the insulating film from the flexible printed circuit so as to expose the conductive portion.

2. The method as set forth in claim 1, further comprising the steps of:
   solidifying the connecting portion provided between the first conductive member and the second conductive member; and
   sealing the connecting portion and an exposed portion of the first and second conductive members with an insulator.

3. The method as set forth in claim 1, wherein the first conductive member and the second conductive member are contacted with each other.

4. The method as set forth in claim 1, wherein the first conductive member and the second conductive member are separated from each other.

5. The method as set forth in claim 1, wherein the first conductive member is piled on the second conductive member in a vertical direction.

6. The method as set forth in claim 1, wherein at least one of the first conductive member and the second conductive member has a through-hole in which the connecting portion electrically connects the first conductive member with the second conductive member via the through-hole.

7. The method as set forth in claim 4, wherein an insulating film is interposed between the first conductive member and the second conductive member.

8. The method as set forth in claim 1, wherein at least one of the first conductive member and the second conductive member has a through-hole in which the connecting portion electrically connects the first conductive member with the second conductive member via the through-hole.

9. A method for connecting conductive members, comprising the steps of:
   providing a first conductive member;
   providing a second conductive member; and
   jetting droplets of molten metal so as to form a connecting portion which electrically connects the first conductive member with the second conductive member;
   wherein a flexible printed circuit is constituted of a conductive portion covered with an insulating film; and
   wherein one of the first conductive member and the second conductive member is an exposed conductive portion which formed by removing the insulating film from the flexible printed circuit so as to expose the conductive portion, and another is a terminal.

10. The method as set forth in claim 9, further comprising the steps of:
    solidifying the connecting portion provided between the first conductive member and the second conductive member; and
    sealing the connecting portion and an exposed portion of the first and second conductive members with an insulator.

11. The method as set forth in claim 9, wherein the first conductive member and the second conductive member are contacted with each other.

12. The method as set forth in claim 9, wherein the first conductive member and the second conductive member are separated from each other.

13. The method as set forth in claim 12, wherein an insulating film is interposed between the first conductive member and the second conductive member.

14. The method as set forth in claim 9, wherein the first conductive member is piled on the second conductive member in a vertical direction.

15. A method for connecting conductive members, comprising the steps of:

providing a first conductive member;

providing a second conductive member; and jetting droplets of molten metal so as to form a connecting portion which electrically connects the first conductive member with the second conductive member, wherein the first conductive member and the second conductive member are contacted with each other.

16. The method as set forth in claim 15, further comprising the steps of:

solidifying the connecting portion provided between the first conductive member and the second conductive member: and sealing the connecting portion and an exposed portion of the first and second conductive members with an insulator.

17. The method as set forth in claim 15, wherein the first conductive member and the second conductive member are separated from each other.

18. The method as set forth in claim 17, wherein an insulating film is interposed between the first conductive member and the second conductive member.

19. The method as set forth in claim 15, wherein the first conductive member is piled on the second conductive member in a vertical direction.

20. The method as set forth in claim 15, wherein at least one of the first conductive member and the second conductive member has a through-hole in which the connecting portion electrically connects the first conductive member with the second conductive member via the through-hole.

21. A method for connecting conductive members, comprising the steps of:

providing a first conductive member;

providing a second conductive member; and jetting droplets of molten metal so as to form a connecting portion which electrically connects the first conductive member with the second conductive member, wherein at least one of the first conductive member and the second conductive member has a through-hole in which the connecting portion electrically connects the first conductive member with the second conductive member via the through-hole.

* * * * *